(12) United States Patent  
Qiu et al.

(10) Patent No.: US 12,444,355 B2  
(45) Date of Patent: Oct. 14, 2025

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuanyou Qiu, Beijing (CN); Yao Huang, Beijing (CN); Pinchao Gu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/033,851

(22) PCT Filed: Oct. 30, 2020

(86) PCT No.: PCT/CN2020/125398  
§ 371 (c)(1),  
(2) Date: Apr. 26, 2023

(87) PCT Pub. No.: WO2022/088071  
PCT Pub. Date: May 5, 2022

(65) Prior Publication Data  
US 2023/0402006 A1  Dec. 14, 2023

(51) Int. Cl.  
    *G09G 3/32*     (2016.01)  
    *G09G 3/3233*     (2016.01)  
    *H10K 59/00*     (2023.01)

(52) U.S. Cl.  
CPC ............. *G09G 3/3233* (2013.01); *G09G 3/32* (2013.01); *G09G 2300/0842* (2013.01); *G09G 2320/0233* (2013.01); *H10K 59/00* (2023.02)

(58) Field of Classification Search  
None  
See application file for complete search history.

(56) References Cited

U.S. PATENT DOCUMENTS

2015/0380472 A1  12/2015  Yamazaki et al.  
2018/0292936 A1  10/2018  Kim et al.  
(Continued)

FOREIGN PATENT DOCUMENTS

CN    108010944 A    5/2018  
CN    108365123 A    8/2018  
(Continued)

OTHER PUBLICATIONS

PCT/CN2020/125398 Search Report dated Jul. 26, 2021.  
(Continued)

*Primary Examiner* — Chanh D Nguyen  
(74) *Attorney, Agent, or Firm* — ArentFox Schiff LLP; Michael Fainberg

(57) ABSTRACT

A display substrate and a display device, the display substrate including first light emitting devices in a first display area, second light emitting devices in a second display area, first pixel driving circuits and second pixel driving circuits, the first pixel driving circuits and the first light emitting devices are correspondingly electrically connected, the second pixel driving circuits at least partially overlap with and are correspondingly electrically connected to the second light emitting devices, and at least one of the second pixel driving circuits has a gate connection electrode. The display substrate further includes connection leads, each of at least some of the connection leads is electrically connected to at least one first pixel driving circuit and one first light emitting device, and orthographic projections of the connection leads and the gate connection electrode on a base substrate do not overlap with each other.

12 Claims, 15 Drawing Sheets

(56) References Cited

U.S. PATENT DOCUMENTS

| | | | |
|---|---|---|---|
| 2019/0197284 A1 | 6/2019 | Park | |
| 2019/0304366 A1* | 10/2019 | Ka | G02F 1/13452 |
| 2020/0075697 A1 | 3/2020 | Xu et al. | |
| 2021/0012706 A1 | 1/2021 | Yang et al. | |
| 2021/0193758 A1* | 6/2021 | Choi | H10K 59/123 |
| 2022/0068211 A1* | 3/2022 | Jeong | H10K 59/131 |
| 2022/0069047 A1* | 3/2022 | Yang | H10K 59/1216 |
| 2022/0102421 A1* | 3/2022 | Yang | H10K 59/353 |
| 2022/0109040 A1* | 4/2022 | Jung | G09G 3/3225 |
| 2022/0285470 A1 | 9/2022 | Qiu et al. | |
| 2022/0320144 A1 | 10/2022 | Han et al. | |
| 2023/0354656 A1* | 11/2023 | Long | H10K 59/00 |

FOREIGN PATENT DOCUMENTS

| | | |
|---|---|---|
| CN | 109143705 A | 1/2019 |
| CN | 111180494 A | 5/2020 |
| CN | 111211137 A | 5/2020 |
| CN | 111261641 A | 6/2020 |
| CN | 111326560 A | 6/2020 |
| CN | 111446282 A | 7/2020 |
| CN | 111490089 A | 8/2020 |
| CN | 111508377 A | 8/2020 |
| CN | 111725287 A | 9/2020 |
| CN | 111785761 A | 10/2020 |
| KR | 10-2016-0007905 A | 1/2016 |

OTHER PUBLICATIONS

Office Action received for Chinese Patent Application No. 202080002593.9, mailed on Mar. 29, 2025, 14 pages (7 pages of English Translation and 7 pages of Original Document).

* cited by examiner

16

17

18

2

19

3

20

4

4

21

20

4

21

22

DISPLAY SUBSTRATE AND DISPLAY DEVICE

CROSS REFERENCE TO RELATED APPLICATIONS

The present disclosure is a National Stage of International Application No. PCT/CN2020/125398, filed Oct. 30, 2020, which is hereby incorporated by reference in its entirety.

FIELD

The present disclosure relates to the technical field of display, in particular to a display substrate and a display apparatus.

BACKGROUND

With rapid development of smart phones, mobile phones are not only required to have attractive appearances, but also to provide better visual experience for mobile phone users. Major manufacturers start to increase a screen-to-body ratio on the smart phones, making a full screen be a new competitive point for the smart phones. With the development of the full screen, the demand for improvement in performance and functionality is also increasing day by day. A camera under panel can bring visual and using experience impact to a certain extent without affecting the high screen-to-body ratio.

SUMMARY

A display substrate provided by an embodiment of the present disclosure includes:
- a base substrate, including a display area and a border area arranged outside the display area; the display area includes: a first display area, and a second display area at least arranged on a side of the first display area;
- a plurality of light emitting devices, arranged on the base substrate in an array; the plurality of light emitting devices include: a plurality of first light emitting devices in the first display area, and a plurality of second light emitting devices in the second display area;
- a plurality of pixel driving circuits, arranged between the base substrate and the light emitting devices; the plurality of pixel driving circuits include: a plurality of first pixel driving circuits and a plurality of second pixel driving circuits, the plurality of first pixel driving circuits and the plurality of first light emitting devices are correspondingly electrically connected, the plurality of second pixel driving circuits at least partially overlap with the plurality of second light emitting devices, and the plurality of second pixel driving circuits are correspondingly electrically connected with the plurality of second light emitting devices, at least one of the plurality of second pixel driving circuits is provided with a driving transistor, a threshold compensation transistor, and a gate connection electrode, the gate connection electrode is electrically connected with a gate electrode of the driving transistor and a source electrode of the threshold compensation transistor, or the gate connection electrode is electrically connected with a gate electrode of the driving transistor and a drain electrode of the threshold compensation transistor; and
- a plurality of connection leads, where each of at least part of the connection leads is electrically connected with at least one first pixel driving circuit and one first light emitting device, and orthographic projections of the connection leads on the base substrate do not overlap an orthographic projection of the gate connection electrode on the base substrate.

In some embodiments, the plurality of connection leads are arranged on a side of a layer where the plurality of pixel driving circuits are located facing away from the base substrate.

In some embodiments, the second display area includes a plurality of pixel driving circuit columns arranged in a first direction, and the plurality of pixel driving circuit columns include: a plurality of first pixel driving circuit columns and a plurality of second pixel driving circuit columns;
- the first pixel driving circuit columns only include the plurality of first pixel driving circuits arranged in a second direction, and the first direction intersects with the second direction;
- the second pixel driving circuit columns include: the plurality of first pixel driving circuits arranged in the second direction, and the second pixel driving circuits located between the at least part of adjacent first pixel driving circuits in the second direction;
- the first display area includes a plurality of first light emitting device columns arranged in the first direction, and each of the plurality of first light emitting devices column includes the plurality of first light emitting devices arranged in the second direction; and each first light emitting device in each of the plurality of first light emitting device column is electrically connected with at least part of the first pixel driving circuits in one corresponding first pixel driving circuit column respectively.

In some embodiments, at least one of the plurality of connection leads includes: a first lead portion extending in the second direction, a second lead portion extending in the second direction, and a third lead portion extending in the first direction and electrically connected with the first lead portion and the second lead portion;
- the first lead portion is led out from the first pixel driving circuit columns and electrically connected with at least part of the first pixel driving circuits in the first pixel driving circuit columns;
- the second lead portion is led out from the first light emitting device columns and electrically connected with the first light emitting devices in the first light emitting device columns;
- an orthographic projection of the third lead portion on the base substrate does not overlap the first display area and the second display area; or,
- at least part of the orthographic projection of the third lead portion on the base substrate does not overlap the first display area and the second display area, and the rest part of the orthographic projection of the third lead portion on the base substrate has overlapping areas with the first display area and the second display area.

In some embodiments, the plurality of connection leads include: first connection leads, arranged between the pixel driving circuits and the light emitting devices, the first connection leads include a plurality of layers of connection sub leads located in different film layers, and the connection sub leads located in different film layers is electrically connected with the different first pixel driving circuits and first light emitting devices respectively.

In some embodiments, orthographic projections of all the connection sub leads located in the different film layers on the base substrate overlap with each other; or, the orthographic projections of the at least two layers of connection sub leads among the plurality of layers of connection sub leads on the base substrate at least partially overlap; or, all the orthographic projections of the plurality of layers of connection sub leads on the base substrate do not overlap with each other.

In some embodiments, the second lead portion only includes the first connection leads, and materials of the first connection leads include transparent materials.

In some embodiments, the transparent materials include at least one of: indium tin oxide or graphene.

In some embodiments, at least one of the light emitting devices includes: an anode, light emitting functional layers, and a cathode, and the anode, the light emitting functional layers, and the cathode are arranged sequentially in a stacked mode; and the connection leads further include: second connection leads, arranged on the same layer as the anode, and the second connection leads are electrically connected with the first connection leads.

In some embodiments, in an area outside the first display area, at least one of the first lead portion and the third lead portion includes the first connection leads and the second connection leads electrically connected with each other.

In some embodiments, the third lead portion is located in the border area adjacent to both the first display area and the second display area.

In some embodiments, the display substrate further includes: a third connection lead electrically connected with the third lead portion in the border area.

In some embodiments, at least one of the plurality of pixel driving circuits includes a gate connection electrode; and the pixel driving circuit further includes: a first gate layer arranged between the base substrate and the gate connection electrode, and a second gate layer arranged between the first gate layer and the gate connection electrode; and the third connection leads are arranged on the same layer as one of the following film layers: the gate connection electrode, the first gate layer, and the second gate layer.

In some embodiments, at least one of the pixel driving circuits further includes: a first transistor and a storage capacitor;

a gate electrode of the first transistor is electrically connected with a first reset signal end, and a source electrode of the first transistors is electrically connected with a first initial signal end;

a drain electrode of the first transistor, a first electrode of the storage capacitor, and the source electrode of the threshold compensation transistor are electrically connected with the gate electrode of the driving transistor;

a gate electrode of the threshold compensation transistor is electrically connected with a scanning signal end; and a second electrode of the storage capacitor is electrically connected with a power signal end.

An embodiment of the present disclosure provides a display apparatus, including the display substrate provided by the embodiment of the present disclosure.

In some embodiments, the display apparatus further includes: a light extraction device, where an orthographic projection of the light extraction device on the base substrate is located in a first display area and a second display area of the display substrate, and the light extraction device is arranged on a side of the display substrate facing away from a light emission surface.

BRIEF DESCRIPTION OF THE DRAWINGS

In order to illustrate technical solutions in embodiments of the present disclosure more clearly, accompanying drawings needing to be used in description of the embodiments will be introduced below briefly. Apparently, the accompanying drawings in the description below are only some embodiments of the present disclosure, those ordinarily skilled in the art can further obtain other accompanying drawings according to these accompanying drawings without inventive efforts.

DETAILED DESCRIPTION OF THE EMBODIMENTS

In order to make objectives, technical solutions and advantages of embodiments of the present disclosure clearer, the technical solutions of the embodiments of the present disclosure will be described below clearly and completely with reference to accompanying drawings of the embodiments of the present disclosure. Apparently, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the scope of protection of the present disclosure.

Unless otherwise defined, technical or scientific terms used in the present disclosure shall have the usual meanings understood by a person of ordinary skill in the art to which the present disclosure belongs. "First", "second" and similar words used in the present disclosure do not indicate any order, quantity or importance, but are only used to distinguish different components. "Including" or "containing" and similar words, mean that an element or item preceding the word covers an element or item listed after the word and the equivalent thereof, without excluding other elements or items. "Connection" or "coupling" and similar words are not limited to physical or mechanical connection, but may include electrical connection, whether direct or indirect.

It should be noted that sizes and shapes of all graphs in the accompanying drawings do not reflect the true scale, and only intend to illustrate the content of the present disclosure.

The same or similar reference numbers represent the same or similar elements or elements with the same or similar functions from beginning to end.

Figure 1:
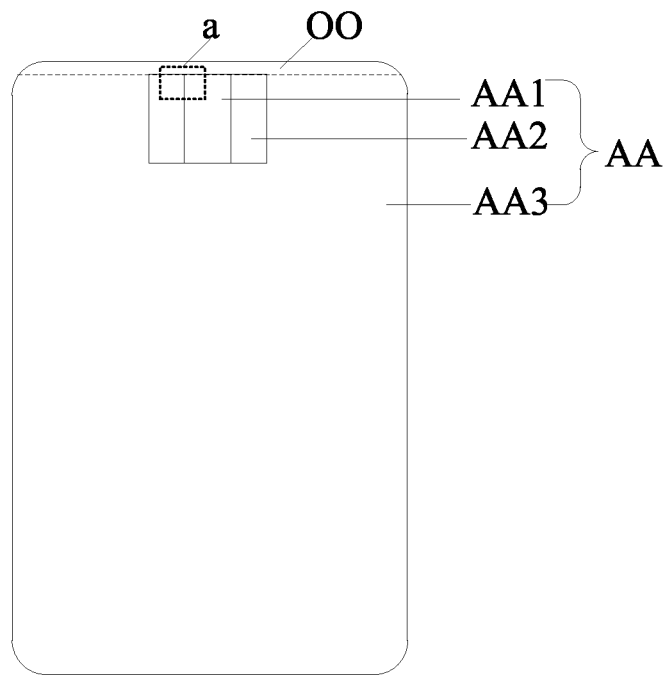
FIG. 1 is a schematic structural diagram of a display apparatus provided by an embodiment of the present disclosure.
Figure 2:
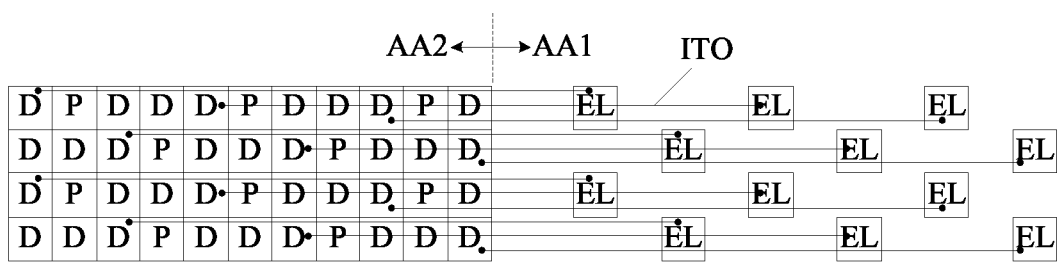
FIG. 2 is a schematic enlarged structural diagram of an area a in FIG. 1 in related art.

As shown in FIG. 1 and FIG. 2, in related art, a display apparatus with a camera under panel structure includes: a first display area AA1 and a second display area AA2, and a camera may be arranged at a position of the first display area AA1. Specifically, the first display area AA1 is internally provided with a plurality of light emitting devices EL, and the second display area AA2 is internally provided with a plurality of pixels P and a plurality of pixel driving circuits D. Each pixel P includes one light emitting device EL and the pixel driving circuit D correspondingly electrically connected with the light emitting device. The pixel driving circuit D separately arranged in the second display area AA2 is used to control the light emitting device EL of the first display area AA1 to emit light. Specifically, as shown in FIG. 2, one light emitting device EL in the first display area AA1 is electrically connected with one pixel driving circuit D in the second display area AA2 through a transparent connection lead ITO.

Figure 3:
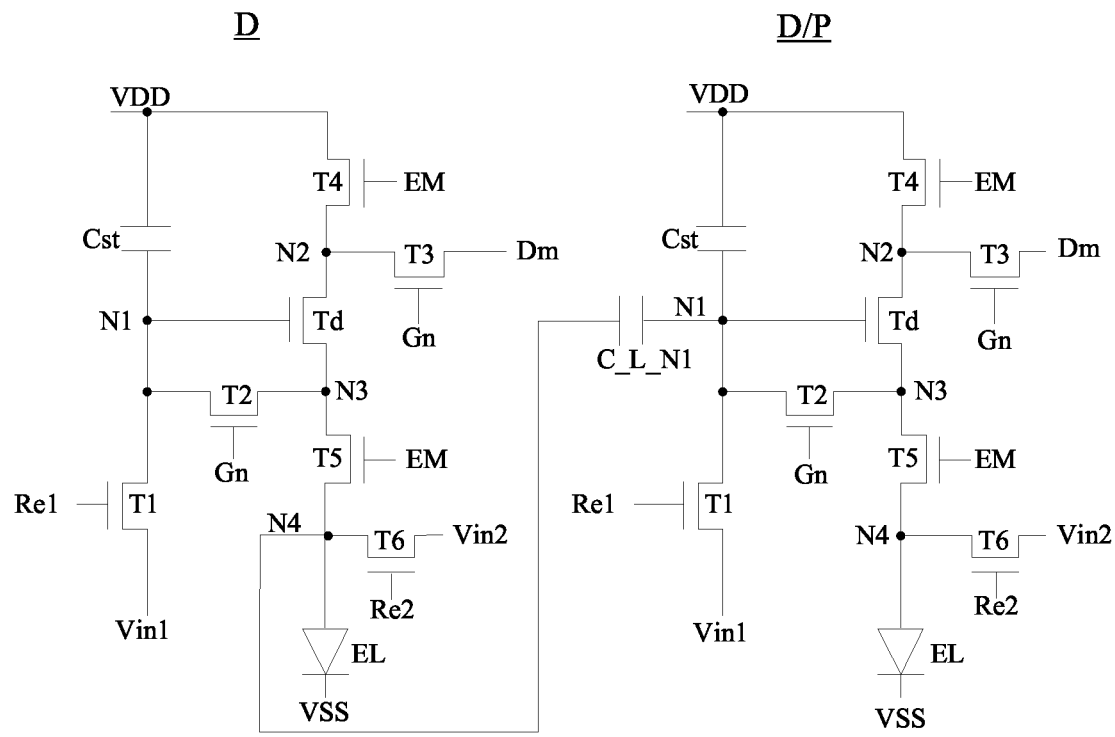
FIG. 3 is a schematic diagram of uneven brightness in related art.

In some embodiments, the pixel driving circuits all have driving transistors and threshold compensation transistors, and gate electrodes of the driving transistors and drain electrodes of the threshold compensation transistors are electrically connected through gate connection electrodes. Taking the pixel driving circuits D being of a 7T1C structure as an example, as shown in FIG. 3, a process that the pixel driving circuit with the 7T1C structure drives the light emitting devices to emit the light may be divided into the following three stages.

In a first stage, under control of a reset signal end Re1, a first transistor T1 is turned on, so that a first initialization signal end Vin1 resets an N1 node, and the remaining transistors are in a cut-off state, wherein the N1 node is electrically connected with the gate electrode of the driving transistor Td.

In a second stage, under control of a scanning signal end Gm, the threshold compensation transistor T2 and a third transistor T3 are turned on, a signal from a data signal end Dm is written to an N2 node through the third transistor T3, and threshold compensation for the driving transistor Td is achieved through the threshold compensation transistor T2. In addition, under control of a second initialization signal end Vin2, a sixth transistor T6 is turned on, so that the second initialization signal end Vin2 resets an N4 node, and the remaining transistors are in the cut-off state. For the pixel P, the N4 node is electrically connected with an anode of the light emitting device EL, and for the pixel driving circuit D that needs to be electrically connected with the light emitting device EL, the N4 node is connected with the anode of the light emitting device EL through the transparent connection lead ITO.

In a third stage, under control of a light emitting control signal end EM, a fourth transistor T4 and a fifth transistor T5 are turned on. At this time, due to presence of a storage capacitor Cst, the driving transistor Td is also turned on in this stage, so as to provide a driving current for the light emitting device EL.

Figure 4:
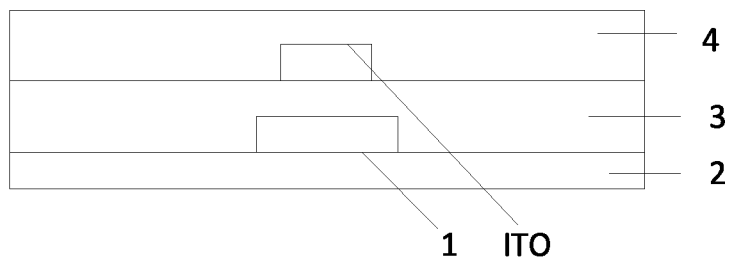
FIG. 4 is a schematic diagram of uneven brightness in related art.

However, when the transparent connection lead crosses the gate connection electrode in the pixel driving circuit D arranged separately or the pixel driving circuit D contained in the pixel P, as shown in FIG. 3, the pixel driving circuit further includes the following insulation layers: an interlayer insulation layer 2, a first planarization layer 3, and a second planarization layer 4. The transparent connection lead ITO overlaps the gate connection electrode 1, only one first planarization layer 3 is included between the transparent connection lead ITO and the gate connection electrode 1. Therefore, as shown in FIG. 4, larger capacitance C_L_N1 will be formed between the transparent connection lead ITO and the N1 node. As shown in FIG. 4, because the transparent connection lead is electrically connected with the N4 node of the pixel driving circuit D, when an N4 voltage jumps after a signal of the light emitting control signal end EM is turned on, a voltage of the N1 node of the pixel driving circuit crossed by the connection lead jumps, and the capacitance between the transparent connection lead and the N1 node of each pixel driving circuit is not exactly the same, resulting in uneven brightness.

Figure 5:
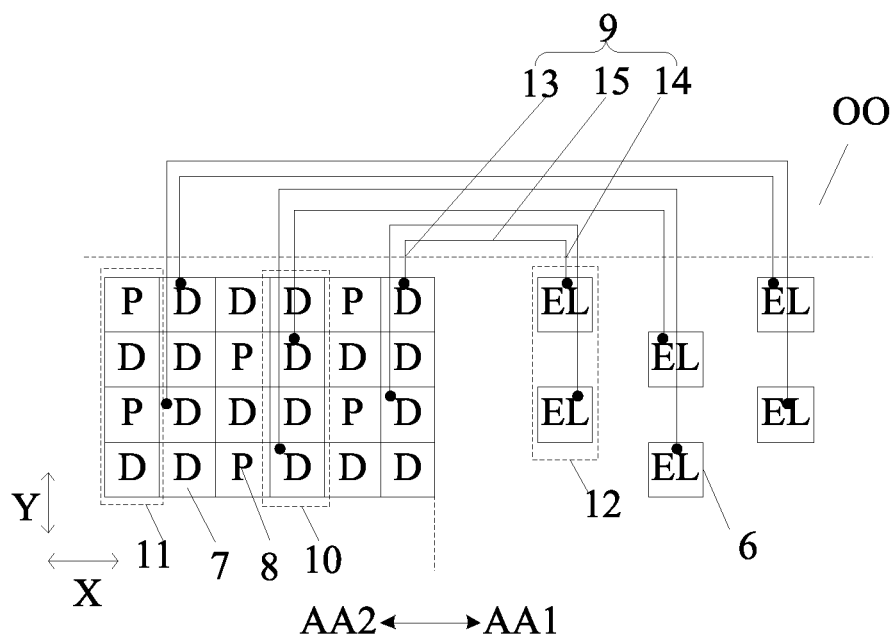
FIG. 5 is a schematic enlarged structural diagram of an area a in FIG. 1 provided by an embodiment of the present disclosure.

In response to solve the above technical problem existing in the related art, an embodiment of the present disclosure provides a display substrate, as shown in FIG. 1 and FIG. 5, wherein FIG. 5 is a structural enlarged diagram of an area a in FIG. 1, and the display substrate includes:
a base substrate, including a display area AA and a border area OO arranged outside the display area AA, the display area AA includes: a first display area AA1, and a second display area AA2 at least arranged on a side of the first display area AA1;
a plurality of light emitting devices EL, arranged on the base substrate in an array, the plurality of light emitting devices EL includes: a plurality of first light emitting devices 6 in the first display area AA1, and a plurality of second light emitting devices (not shown) in the second display area AA2;
a plurality of pixel driving circuits, arranged in the second display area AA2 and arranged between the base substrate and the light emitting devices, the plurality of pixel driving circuits includes: a plurality of first pixel driving circuits 7 and a plurality of second pixel driving circuits 8, and the plurality of first pixel driving circuits 7 and the plurality of first light emitting devices 6 are correspondingly electrically connected, the plurality of second pixel driving circuits 8 at least partially overlap with the plurality of second light emitting devices 8, and the plurality of second pixel driving circuits 8 are correspondingly electrically connected with the plurality of second light emitting devices, at least one of the plurality of second pixel driving circuits is provided with a driving transistor, a threshold compensation transistor, and a gate connection electrode, and the gate connection electrode is electrically connected with a gate electrode of the driving transistor and a source electrode of the threshold compensation transistor or the gate connection electrode is electrically connected with a gate electrode of the driving transistor and a drain electrode of the threshold compensation transistor; and
a plurality of connection leads 9, wherein each of at least part of the connection leads 9 is electrically connected with the at least one first pixel driving circuit 7 and one first light emitting device 6, and orthographic projections of the connection leads on the base substrate do not overlap an orthographic projection of the gate connection electrode on the base substrate.

According to the display substrate provided by the embodiment of the present disclosure, the orthographic projections of the connection leads on the base substrate do not overlap the orthographic projection of the gate connection electrode on the base substrate, so that the connection leads avoid the gate connection electrode, thereby avoiding formation of capacitance between the connection leads and the gate connection electrode, thus avoiding a jump of a driving current provided by the second pixel driving circuits, avoiding uneven brightness of light emission, and improving uniformity of light emitting brightness.

In some embodiments, as shown in FIG. 1, the display area further includes a third display area AA3. A pixel density of both the first display area AA1 and the second display area AA2 is smaller than that of the third display area AA3. Light transmittance of the first display area AA1 is greater than that of the second display area AA2. In some embodiments, as shown in FIG. 1, a shape of the first display area AA1, a shape of the second display area AA2, and a shape of an area composed of the first display area AA1 and the second display area AA2 are all rectangles. Certainly, the shape of the first display area AA1, the shape of the second display area AA2, and the shape of the area composed of the first display area AA1 and the second display area AA2 may also be other shapes. In some embodiments, the shape of the area composed of the first display area AA1 and the second display area AA2 may be a circle, and the shape of the first display area AA1 may also be a circle.

In some embodiments, the first pixel driving circuits electrically connected with the different light emitting devices through the connection leads are different. Or, in some embodiments, the different light emitting devices are electrically connected with the same first pixel driving circuit through the different connection leads respectively.

In some embodiments, the plurality of connection leads are located on one side of a layer where the plurality of pixel driving circuits are located facing away from the base substrate.

In some embodiments, as shown in FIG. 5, the second display area AA2 includes a plurality of pixel driving circuit columns arranged in a first direction X, and the plurality of pixel driving circuit columns include: a plurality of first pixel driving circuit columns 10 and a plurality of second pixel driving circuit columns 11;
the first pixel driving circuit columns 10 only include the plurality of first pixel driving circuits 7 arranged in a second direction Y, and the first direction X intersects with the second direction Y;
the second pixel driving circuit columns 11 include: the first pixel driving circuits 7 arranged in the second direction Y, and the second pixel driving circuits 8 located between the at least part of adjacent first pixel driving circuits 7 in the second direction Y;
the first display area AA1 includes a plurality of first light emitting device columns 12 arranged in the first direction X, and each first light emitting device column 12 includes the plurality of first light emitting devices 6 arranged in the second direction Y; and
each first light emitting device 6 in each first light emitting device column 12 is electrically connected with at least part of the first pixel driving circuits 7 in one corresponding first pixel driving circuit column 10 respectively.

According to the display substrate provided by the embodiment of the present disclosure, one first light emitting device column located in the first display area corresponds to one first pixel driving circuit column located in the second display area, thereby ensuring that the connection leads and the gate connection electrode of the second pixel driving circuit do not overlap, while making an arrangement of the connection leads be easy to achieve.

In some embodiments, as shown in FIG. 5, when the quantity of first light emitting devices 6 in one first light emitting device column 12 is smaller than the quantity of first pixel driving circuits 7 in one first pixel driving circuit column 10, the first light emitting devices 6 in one first light emitting device column 12 are electrically connected with part of first pixel driving circuits 7 in one first pixel driving circuit column 10.

In some embodiments, as shown in FIG. 5, the first pixel driving circuit columns 10 and the second pixel driving circuit columns 11 are arranged alternately. In some embodiments, it may also be that the plurality of first pixel driving circuit columns are included between the adjacent second pixel driving circuit columns, or the plurality of second pixel driving circuit columns are included between the adjacent first pixel driving circuit columns, or the plurality of first pixel driving circuit columns are adjacent, or the plurality of second pixel driving circuit columns are adjacent, etc.

In some embodiments, as shown in FIG. 5, in the second pixel driving circuit columns 11, the first pixel driving circuits 7 and the second pixel driving circuits 8 are arranged alternately. In some embodiments, in the second pixel driving circuit columns, it may also be that the plurality of first pixel driving circuits are included between the adjacent second pixel driving circuits, or the plurality of second pixel driving circuits are included between the adjacent first pixel driving circuits.

In some embodiments, the first pixel driving circuits, not electrically connected with the first light emitting devices, in the first pixel driving circuit columns, and the first pixel driving circuits in the second pixel driving circuit columns serve as the pixel driving circuits in virtual pixels. When displaying, the virtual pixels do not emit light, and an arrangement of the virtual pixels may ensure display uniformity of a display product.

In some embodiments, as shown in FIG. 5, the first direction X is perpendicular to the second direction Y.

In some embodiments, as shown in FIG. 5, each of the connection leads 9 includes: a first lead portion 13 extending in the second direction Y, and a second lead portion 14 extending in the second direction Y, and a third lead portion 15 extending in the first direction X and electrically connected with the first lead portion 13 and the second lead portion 14;

the first lead portion 13 is led out from the first pixel driving circuit columns 10 and electrically connected with at least part of the first pixel driving circuits 7 in the first pixel driving circuit columns 10;

the second lead portion 14 is led out from the first light emitting device columns 12 and electrically connected with the first light emitting devices 6 in the first light emitting device columns 12; and an orthographic projection of the third lead portion 15 on the base substrate does not overlap the first display area AA1 and the second display area AA2.

According to the display substrate provided by the embodiment of the present disclosure, extension directions of the connection leads are not single any more. The connection leads include the first lead portion and the second lead portion which extend in the second direction, and the third lead portion extending in the first direction. The first lead portion electrically connected with the first pixel driving circuits is led out from the first pixel driving circuit columns, and the first lead portion does not overlap the gate connection electrode of the second pixel driving circuit. Therefore, the first lead portion does not overlap the gate connection electrode of the second pixel driving circuit, so as to avoid the formation of capacitance between the first lead portion and the gate connection electrode. Moreover, the second lead portion is led out from the first light emitting device columns, and the second lead portion does not overlap both the first pixel driving circuits and the second pixel driving circuits. The third lead portion is electrically connected with the first lead portion and the second lead portion, and even if the third lead portion extends in the first direction, the third lead portion does not overlap both the first pixel driving circuits and the second pixel driving circuits. That is, capacitance is not formed between the second lead portion and the gate connection electrode as well as between the third lead portion and the gate connection electrode. Therefore, an arrangement mode of the connection leads in the display substrate provided by the embodiment of the present disclosure will not cause the jump of the driving current in the pixel driving circuit, which can avoid uneven light emitting brightness and improve the uniformity of light emitting brightness.

In some embodiments, each of the plurality of connection leads includes: the first lead portion extending in the second direction, and the second lead portion extending in the second direction, and the third lead portion extending in the first direction and electrically connected with the first lead portion and the second lead portion;

the first lead portion is led out from the first pixel driving circuit columns and electrically connected with at least part of the first pixel driving circuits in the first pixel driving circuit columns;

the second lead portion is led out from the first light emitting device columns and electrically connected with the first light emitting devices in the first light emitting device columns; and at least part of the orthographic projection of the third lead portion on the base substrate does not overlap the first display area and the second display area, and the rest part of the orthographic projection of the third lead portion on the base substrate has overlapping areas with the first display area and the second display area.

It should be noted that FIG. 5 takes an example of each third connection lead located on the same side of the second display area and not overlapping both the first display area and the second display area for illustration. In some embodiments, among the plurality of third connection leads, it may be that part of the third connection leads is located in the border area, while the rest part of third connection leads is located in an area between pixel driving circuit rows. In this way, the third connection leads located between the pixel driving circuit rows still do not overlap the gate connection electrode and do not form capacitance with the gate connection electrode. Therefore, the arrangement mode of the connection leads in the display substrate provided by the embodiment of the present disclosure will not cause the jump of the driving current in the pixel driving circuit, which can avoid uneven light emitting brightness and improve the uniformity of light emitting brightness.

In some embodiments, as shown in FIG. 5, in the second direction Y, each third lead portion 15 is located on the same side of the second display area AA2.

In some embodiments, as shown in FIG. 5, lengths of the different third lead portions 15 are different. In some embodiments, as shown in FIG. 5, the lengths of the third lead portions 15 near the second display area AA2 are smaller than the lengths of the third lead portions 15 away from the second display area AA2. Thus, as shown in FIG. 5, when each first light emitting device 6 in each first light emitting device column 12 is electrically connected with at least part of the first pixel driving circuits 7 in one first pixel driving circuit column 10 respectively, the first lead portion 13, the second lead portion 14, and the third lead portion 15 in each connection lead 9 do not have overlapping areas with the other connection leads 9, and an arrangement process of the plurality of connection leads 9 is simple and easy to implement.

In some embodiments, at least one of the first pixel driving circuits has a driving transistor and a threshold compensation transistor;
at least one of the plurality of first pixel driving circuits further includes:
a gate connection electrode, electrically connected with a gate electrode of the driving transistor and a drain electrode of the threshold compensation transistor; and
an orthographic projection of the first lead portion on the base substrate does not overlap with the orthographic projection of the gate connection electrode on the base substrate.

In this way, according to the display substrate provided by the embodiment of the present disclosure, the orthographic projection of the first lead portion on the base substrate does not overlap the orthographic projection of the gate connection electrode of any pixel driving circuit on the base substrate, that is, the first lead portion avoids the gate connection electrode of any pixel driving circuit, thereby avoiding the formation of capacitance between the first lead portion and the gate connection electrode in any pixel driving circuit, avoiding the jump of the driving current in each pixel driving circuit, and further improving the uniformity of light emitting brightness.

In some embodiments, the connection leads include: first connection leads, located between the pixel driving circuits and the light emitting devices.

In some embodiments, the first connection leads only include one conductive layer.

In some embodiments, the first connection leads include a plurality of layers of connection sub leads located in different film layers. That is, the first connection leads include a plurality of conductive layers located in the different film layers. Each layer of connection sub leads among the plurality of layers of connection sub leads is electrically connected with the at least one first pixel driving circuit and one first light emitting device respectively.

According to the display substrate provided by the embodiment of the present disclosure, each layer of connection sub leads among the plurality of layers of connection sub leads is electrically connected with the at least one first pixel driving circuit and one first light emitting device respectively, thereby saving a wiring space for the first connection leads.

In some embodiments, orthographic projections of all the connection sub leads located in the different film layers on the base substrate overlap; or, the orthographic projections of the at least two layers of connection sub leads among the plurality of layers of connection sub leads on the base substrate at least partially overlap; or, the orthographic projections of the plurality of layers of connection sub leads on the base substrate do not overlap.

Figure 6:
FIG. 6 is a schematic structural diagram of a first connection lead provided by an embodiment of the present disclosure.
Figure 7:
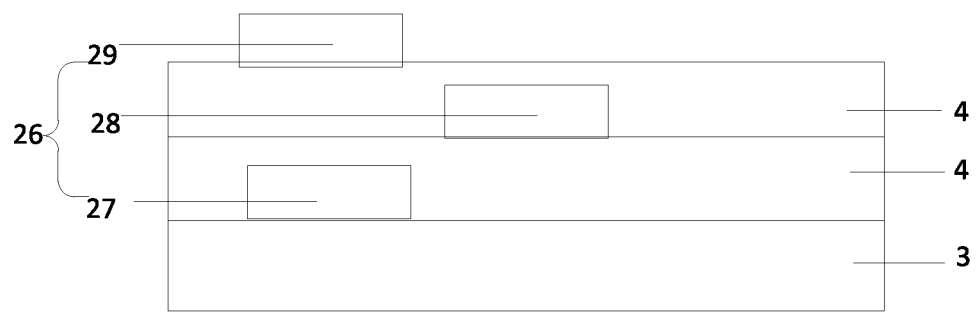
FIG. 7 is a schematic structural diagram of another first connection lead provided by an embodiment of the present disclosure.
Figure 8:
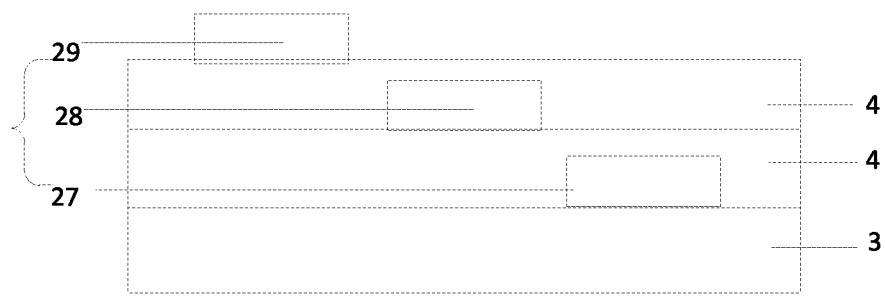
FIG. 8 is a schematic structural diagram of further another first connection lead provided by an embodiment of the present disclosure.

In some embodiments, as shown in FIG. 6, FIG. 7 and FIG. 8, the first connection leads include, for example, a first connection sub lead 27, a second connection sub lead 28, and a third connection sub lead 29 which are located in different film layers. As shown in FIG. 6, orthographic projections of the first connection sub lead 27, the second connection sub lead 28, and the third connection sub lead 29 on the base substrate overlap. Or, as shown in FIG. 7, the orthographic projections of at least two layers of the first connection sub lead 27, the second connection sub lead 28, and the third connection sub lead 29 on the base substrate at least partially overlap. Or, as shown in FIG. 8, the orthographic projections of the first connection sub lead 27, the second connection sub lead 28, and the third connection sub lead 29 on the base substrate do not overlap. It should be noted that in FIG. 6 to FIG. 8, the first connection sub lead 27 is located on a first planarization layer 3, and a second planarization layer 4 is included between the first connection sub lead 27 and the second connection sub lead 28, as well as between the second connection sub lead 28 and the third connection sub lead 29.

In some embodiments, materials of the first connection leads include transparent materials.

In some embodiments, the transparent materials include at least one of: indium tin oxide, and graphene.

In some embodiments, the second lead portion only includes the first connection leads.

According to the display substrate provided by the embodiment of the present disclosure, the second lead portion only includes the first connection leads, that is, the second lead portion is a transparent lead, thereby avoiding affecting the light transmittance of the first display area.

In some embodiments, the connection leads only include the first connection leads.

In some embodiments, each of the light emitting devices include: a anode, light emitting functional layers, and a cathode which are arranged sequentially in a stacked mode.

In some embodiments, the light emitting functional layers include organic light emitting layers, and may further include film layers such as a hole injection layer, a hole transport layer, an electron transport layer, and an electron injection layer.

When the connection leads include the first connection leads, in some embodiments, the connection leads further include: second connection leads, arranged on the same layer as the anodes and electrically connected with the first connection leads.

In some embodiments, the first lead portion only includes the second connection leads.

According to the display substrate provided by the embodiment of the present disclosure, because the first lead portion avoids the gate connection electrode of any pixel driving circuit, when the first lead portion is the first connection leads, a wiring space of the first lead portion is relatively small, which may limit the quantity of the first lead portion. When the first lead portion is replaced from the first connection leads to the second connection leads, the loss of the wiring space and the quantity of the leads due to the fact that the first connection leads avoid the gate connection electrode of any pixel driving circuit may be compensated.

In some embodiments, the first lead portion and the third lead portion may only include one of the first connection leads and the second connection leads.

In some embodiments, in an area outside the first display area, at least one of the first lead portion or the third lead portion includes the first connection leads and the second connection leads which are electrically connected. That is, in the area outside the first display area, the connection leads may be wired in a double-layer mode to reduce resistance of the connection leads.

In some embodiments, when the connection leads include the first connection leads and the second connection leads, in order to ensure the light transmittance of the first display area, the second lead portion only includes the first connection leads. The third lead portion may only include the first connection leads, or the third lead portion may only include the second connection leads.

In some embodiments, as shown in FIG. 5, the third lead portion 15 is located in the border area OO adjacent to both the first display area AA1 and the second display area AA2.

In some embodiments, the display substrate further includes: the third connection lead electrically connected with the third lead portion in the border area.

The display substrate provided by the embodiment of the present disclosure is provided with the third connection leads electrically connected with the third lead portion, thereby reducing the resistance of the connection leads.

In some embodiments, the pixel driving circuit further includes: a first gate layer located between the base substrate and the gate connection electrode, and a second gate layer located between the first gate layer and the gate connection electrode; and the third connection leads are arranged on the same layer as one of the following film layers: the gate connection electrode, the first gate layer, and the second gate layer.

In some embodiments, the pixel driving circuits may be of a 7T1C structure as shown in FIG. 3. The pixel driving circuits include: a threshold compensation transistor T2 and a driving transistor Td, and further includes: a first transistor T1, a third transistor T3, a fourth transistor T4, a fifth transistor T5, a sixth transistor T6, and a storage capacitor Cst.

A gate electrode of the first transistor T1 is electrically connected with a first reset signal end Re1, and a source electrode of the first transistor T1 is electrically connected with a first initial signal end Vin1; a drain electrode of the first transistor T1, a first electrode of the storage capacitor Cst, a source electrode of the threshold compensation transistor T2, and a gate electrode of the driving transistor Td are electrically connected; a gate electrode of the threshold compensation transistor T2 and a gate electrode of the third transistor T3 are electrically connected with a scanning signal end Gm; a drain electrode of the threshold compensation transistor T2, a drain electrode of the driving transistor Td, and a source electrode of the fifth transistor T5 are electrically connected; a source electrode of the driving transistor Td, a drain electrode of the third transistor T3, and a drain electrode of the fourth transistor T4 are electrically connected; a source electrode of the third transistor T3 is electrically connected with a data signal end Dm; a gate electrode of the fourth transistor T4 and a gate of the fifth transistor T5 are electrically connected with a light emitting control signal end EM; a source electrode of the fourth transistor T4 and a second electrode of the storage capacitor Cst are electrically connected with a power signal end VDD; a drain electrode of the fifth transistor T5 and a drain electrode of the sixth transistor T6 are electrically connected with a light emitting device EL; and a gate electrode of the sixth transistor T6 is electrically connected with a second reset signal end Re2, and a source electrode of the sixth transistor T6 is electrically connected with a second initial signal end Vin2.

Next, taking the pixel driving circuit of the 7T1C structure shown in FIG. 3 as an example, the specific film layer structures of the pixel driving circuits, the connection leads, and the light emitting devices in the display substrate provided by the embodiment of the present disclosure are introduced.

In some embodiments, each transistor may be of a top gate structure, as shown in FIG. 9 to FIG. 22, the display substrate specifically includes: an active layer 16 located on the base substrate, a first gate insulation layer located on the active layer, the first gate layer 17 located on the first gate insulation layer, a second gate insulation layer located on the first gate layer 17, the second gate layer 18 located on the second gate insulation layer, an interlayer insulation layer 2 located on the second gate layer 18, a source-drain electrode layer 19 located on the interlayer insulation layer 2, the first planarization layer 3 located on the source-drain electrode layer 19, a first conductive layer 20 located on the first planarization layer 3, the second planarization layer 4 located on the first conductive layer 20, an anode layer 21 and a pixel defining layer 22 located on the second planarization layer 4, a light emitting functional layer located on the anode layer 21, and a cathode layer located on the light emitting functional layer.

Figure 9:
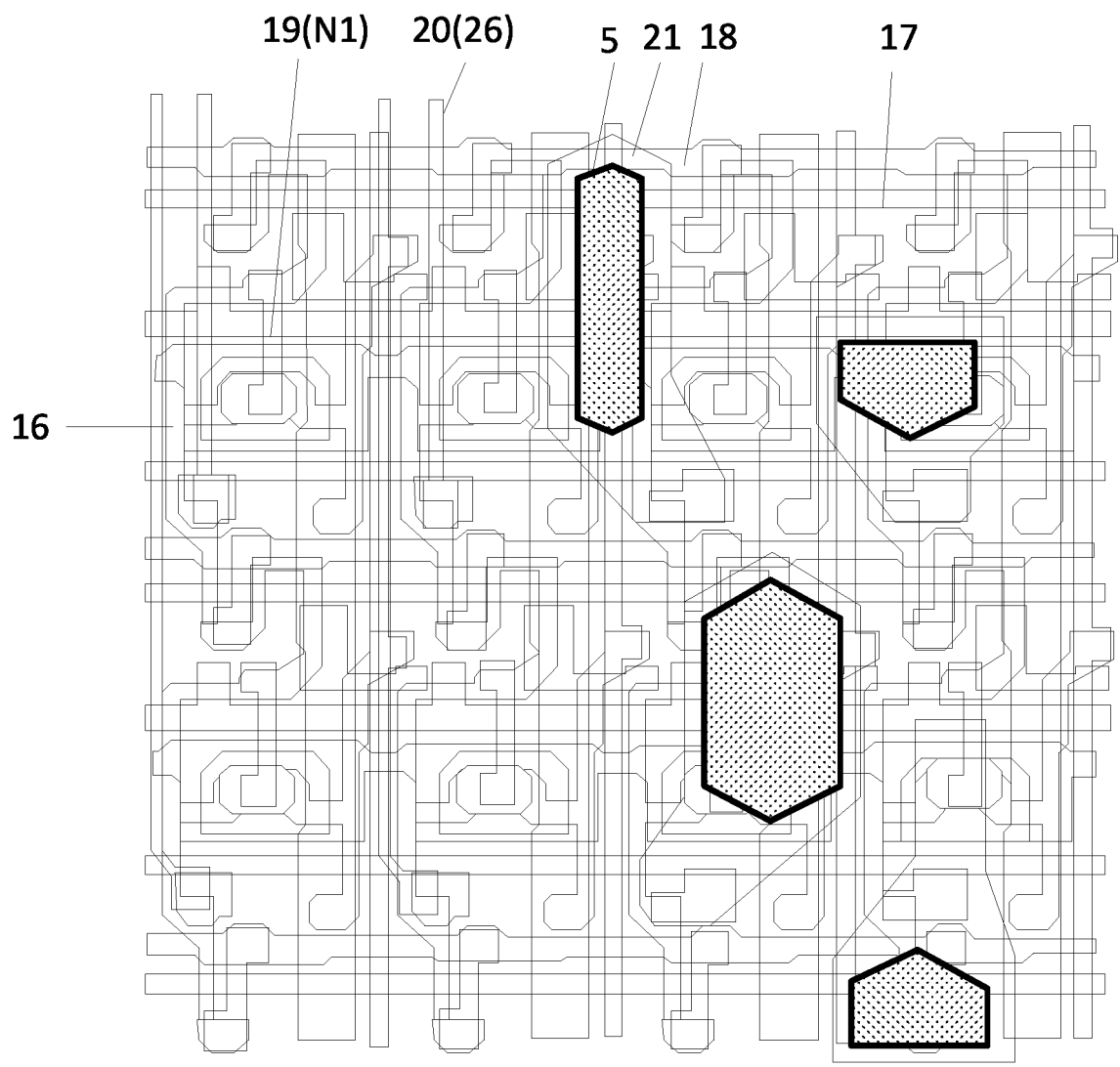
FIG. 9 is a schematic structural diagram of a second display area of a display substrate provided by an embodiment of the present disclosure.
Figure 10:
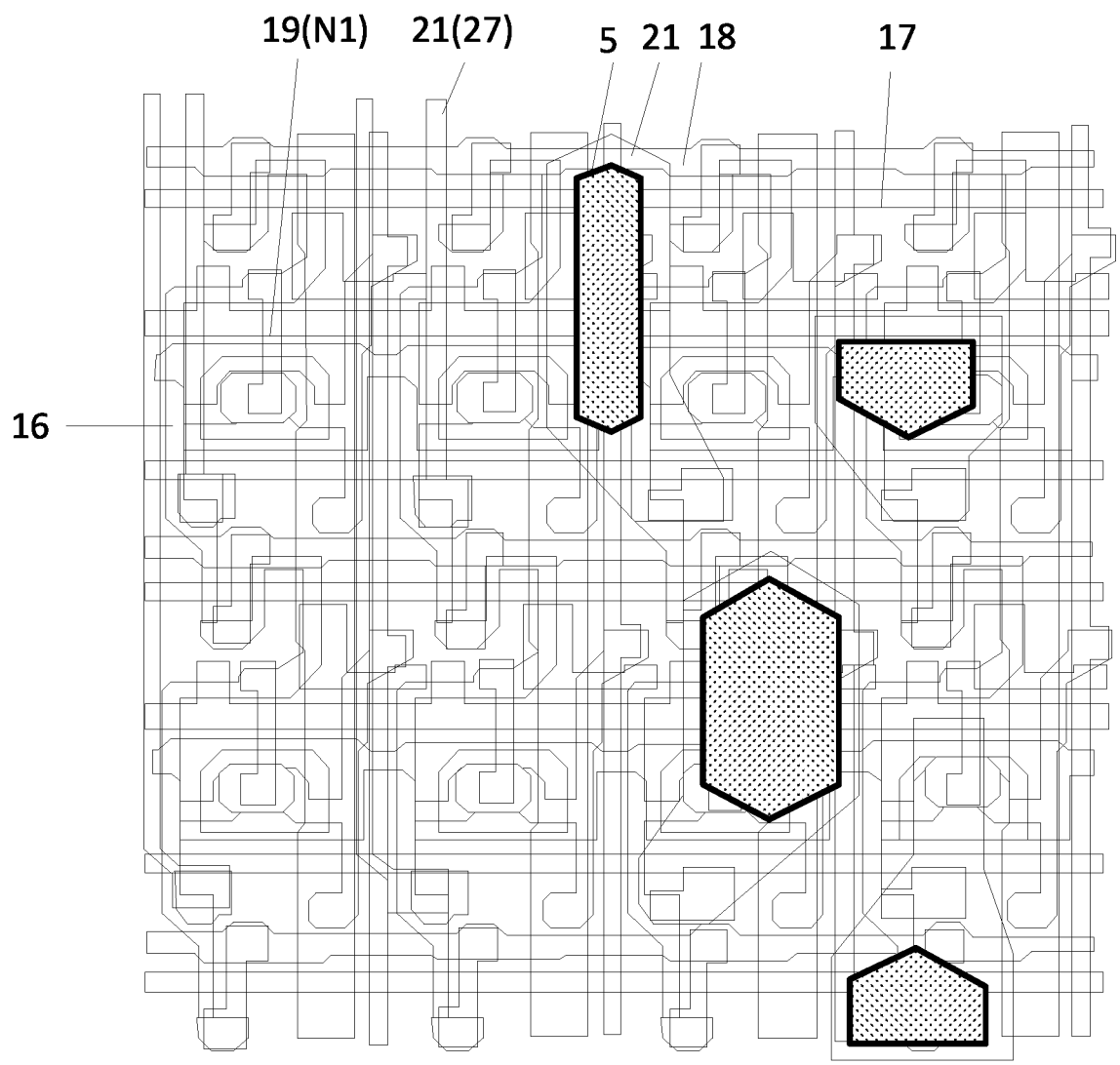
FIG. 10 is a schematic structural diagram of a second display area of another display substrate provided by an embodiment of the present disclosure.

It should be noted that according to the display substrate provided by the embodiment of the present disclosure, as shown in FIG. 9, the first lead portion only includes the first connection leads. According to the display substrate provided by the embodiment of the present disclosure, as shown in FIG. 10, the first lead portion only includes the second connection leads.

Figure 11:
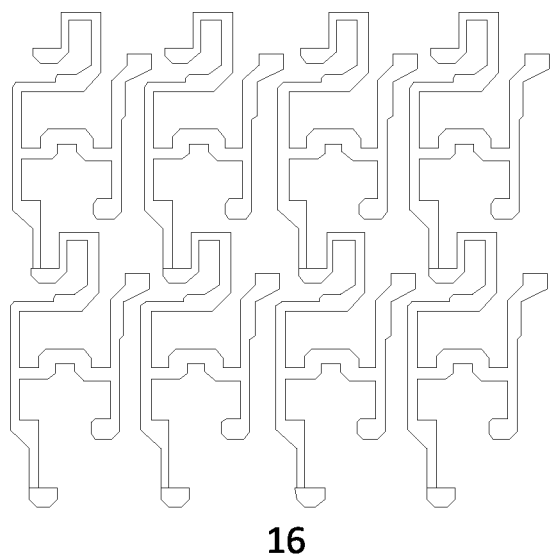
FIG. 11 is a schematic diagram of an active layer in a second display area of a display substrate provided by an embodiment of the present disclosure.

In some embodiments, a pattern of the active layer 16 is shown in FIG. 11. The active layer includes, for example, a source contact area, a drain contact area, and a channel area between the source contact area and the drain contact area of each transistor. In some embodiments, the active layer may be manufactured by adopting amorphous silicon, polysilicon, oxide semiconductor materials, or the like. It should be noted that the source contact area and the drain contact area may be areas doped with n-type impurities or p-type impurities.

Figure 12:
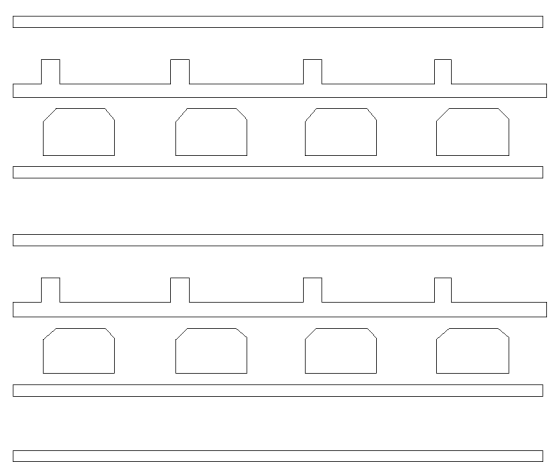
FIG. 12 is a schematic diagram of a first gate layer in a second display area of a display substrate provided by an embodiment of the present disclosure.

In some embodiments, a pattern of the first gate layer 17 is shown in FIG. 12. The first gate layer includes, for example, the second electrode of the storage capacitor, a scanning signal line, a reset signal line, a light emitting control signal line, and the gate of each transistor.

Figure 13:
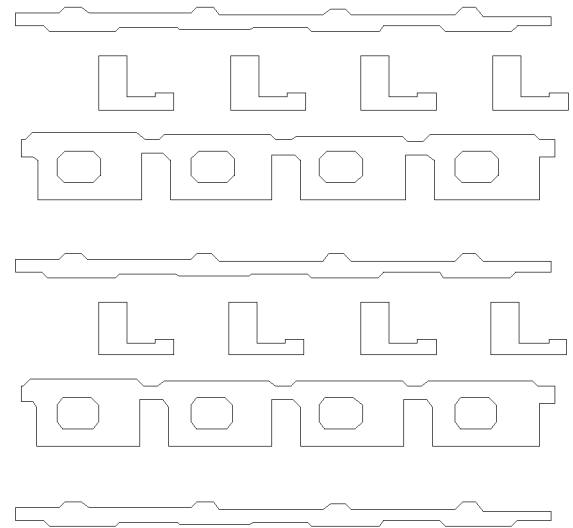
FIG. 13 is a schematic diagram of a second gate layer in a second display area of a display substrate provided by an embodiment of the present disclosure.

In some embodiments, a pattern of the second gate layer 18 is shown in FIG. 13. The second gate layer includes, for example, the first electrode of the storage capacitor, an initialization line, and a light shading layer. The first electrode of the storage capacitor and the second electrode of the storage capacitor at least partially overlap to form the storage capacitor.

Figure 14:
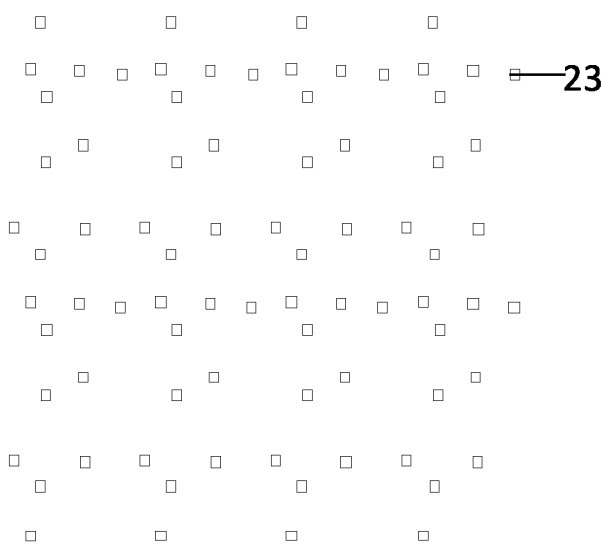
FIG. 14 is a schematic diagram of an opening of an interlayer insulation layer in a second display area of a display substrate provided by an embodiment of the present disclosure.

In some embodiments, a pattern of an opening 23 of the interlayer insulation layer 2 is shown in FIG. 14.

Figure 15:
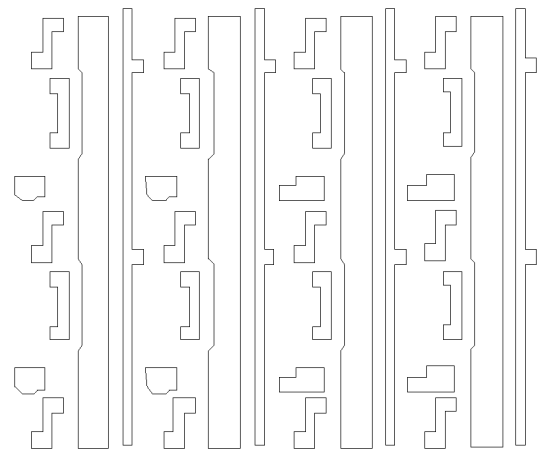
FIG. 15 is a schematic diagram of a source-drain metal layer in a second display area of a display substrate provided by an embodiment of the present disclosure.

In some embodiments, a pattern of the source-drain metal layer 19 is shown in FIG. 15. The source-drain metal layer includes, for example, a first power signal line, a data signal line, the source electrode and drain electrode of each transistor, and an electrode connection portion. The electrode connection portion includes a gate connection electrode that is electrically connected with the gate electrode of the driving transistor and the drain electrode of the threshold compensation transistor, and the gate connection electrode corresponds to a part of an N1 node in the source-drain metal layer. The source-drain metal layer is, for example, electrically connected with the active layer or a gate layer through an opening of the interlayer insulation layer.

Figure 16:
FIG. 16 is a schematic diagram of an opening of a first planarization layer in a second display area of a display substrate provided by an embodiment of the present disclosure.
Figure 16:

In some embodiments, a pattern of an opening 24 of the first planarization layer 3 is shown in FIG. 16.

Figure 17:
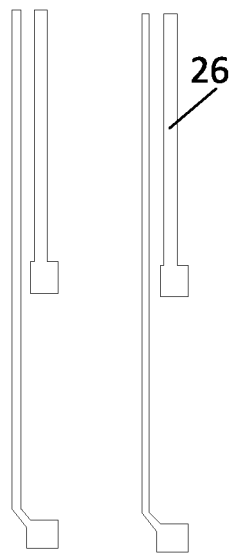
FIG. 17 is a schematic diagram of a first conductive layer in a second display area of a display substrate provided by an embodiment of the present disclosure.

In some embodiments, a pattern of the first conductive layer 20 is shown in FIG. 17. The first conductive layer 20 includes a first connection lead 26. The first connection lead is, for example, electrically connected with the source-drain electrode layer through the opening of the first planarization layer.

Figure 18:
FIG. 18 is a schematic diagram of an opening of a second planarization layer in a second display area of a display substrate provided by an embodiment of the present disclosure.
Figure 18:
Figures 19, 20:
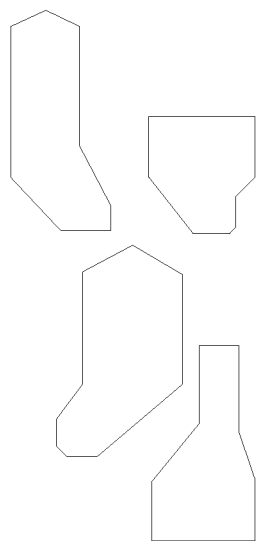
FIG. 19 is a schematic diagram of an opening of a second planarization layer in a second display area of another display substrate provided by an embodiment of the present disclosure.
FIG. 20 is a schematic diagram of an anode layer in a second display area of a display substrate provided by an embodiment of the present disclosure.

In some embodiments, a pattern of an opening 25 of the second planarization layer 4 is shown in FIG. 18 and FIG. 19. FIG. 18 corresponds to the pattern of the opening of the second planarization layer of the display substrate provided in FIG. 9. FIG. 19 corresponds to the pattern of the opening of the second planarization layer of the display substrate provided in FIG. 10.

Figure 21:
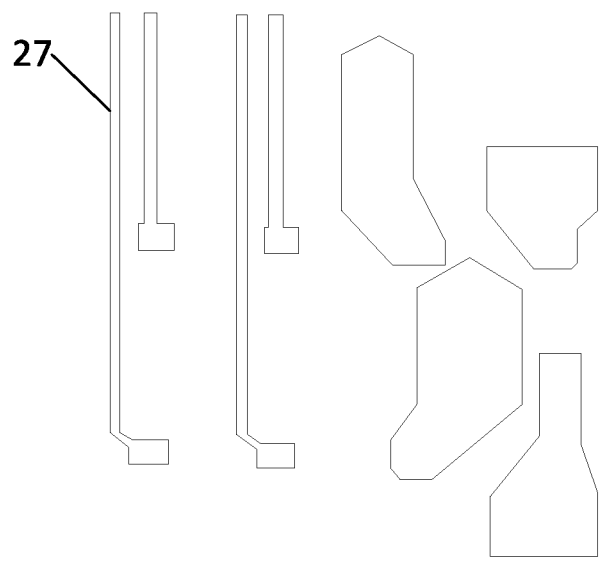
FIG. 21 is a schematic diagram of an anode layer in a second display area of another display substrate provided by an embodiment of the present disclosure.

In some embodiments, a pattern of the anode layer 21 is shown in FIG. 20 and FIG. 21. In some embodiments, as shown in FIG. 20, the anode layer 21 includes an anode of the light emitting device. The anode is electrically connected with the source-drain electrode layer through the opening of the second planarization layer and the opening of the first planarization layer. In some embodiments, as shown in FIG. 21, the anode layer 21 further includes the second connection lead 27. The anode layer is electrically connected with the source-drain electrode layer through the opening of the second planarization layer and the opening of the first planarization layer.

Figure 22:
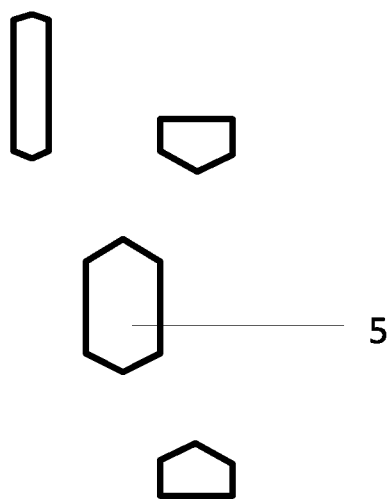
FIG. 22 is a schematic diagram of an opening of a pixel defining layer in a second display area of a display substrate provided by an embodiment of the present disclosure.

In some embodiments, a pattern of an opening 5 of the pixel defining layer 22 is shown in FIG. 22. The opening of the pixel defining layer exposes part of the anode.

Figure 23:
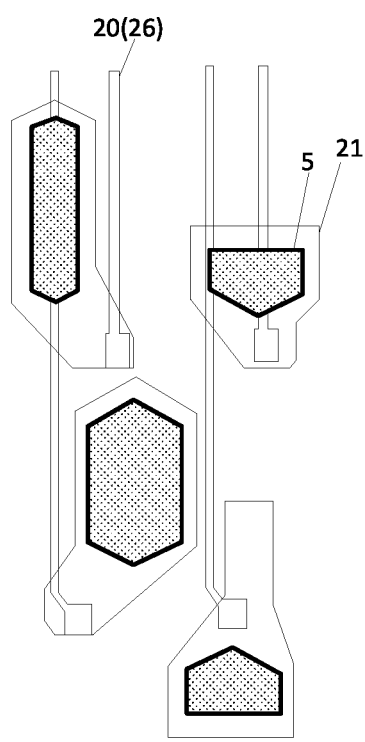
FIG. 23 is a schematic structural diagram of a first display area of a display substrate provided by an embodiment of the present disclosure.

In some embodiments, a structure of the light emitting device in the first display area is shown in FIG. 23.

Figure 24:
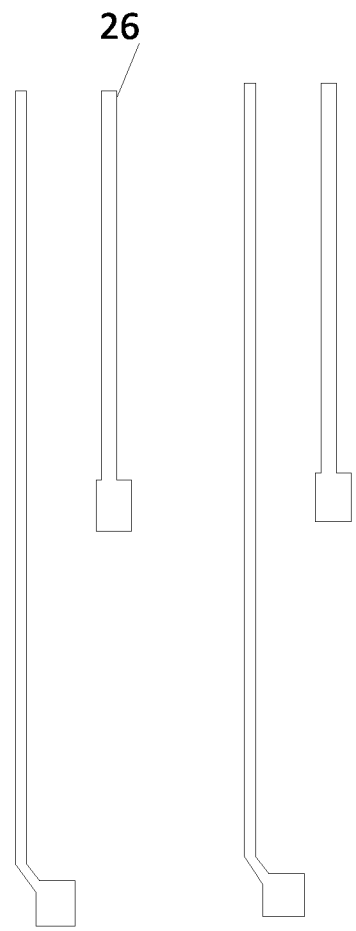
FIG. 24 is a schematic diagram of a first conductive layer in a first display area of a display substrate provided by an embodiment of the present disclosure.

In some embodiments, a pattern of the first conductive layer 20 in the first display area is shown in FIG. 24. The first conductive layer 20 in the first display area includes the first connection lead 26.

Figure 25:
FIG. 25 is a schematic diagram of an opening of a second planarization layer in a first display area of a display substrate provided by an embodiment of the present disclosure.
Figure 25:

In some embodiments, the pattern of the opening 25 of the second planarization layer 4 in the first display area is shown in FIG. 25.

Figure 26:
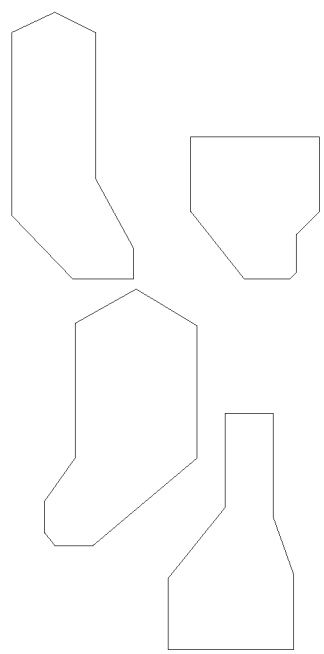
FIG. 26 is a schematic diagram of an anode layer in a first display area of a display substrate provided by an embodiment of the present disclosure.

In some embodiments, the pattern of the anode layer 21 in the first display area is shown in FIG. 26.

Figure 27:
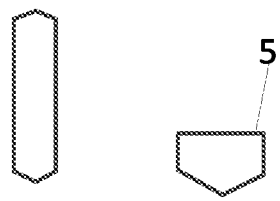
FIG. 27 is a schematic diagram of a pixel defining layer in a first display area of a display substrate provided by an embodiment of the present disclosure.
Figure 27:
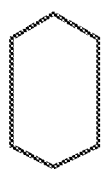
Figure 27:

In some embodiments, the pattern of the opening 5 of the pixel defining layer 22 in the first display area is shown in FIG. 27.

An embodiment of the present disclosure further provides a display panel, including the above display substrate provided by the embodiment of the present disclosure.

In some embodiments, the display panel may be an organic light emitting diode (OLED) display panel, a quantum dot light emitting diode (QLED) display panel, or a micro light emitting diode (Micro LED) display panel. It should be understood by those ordinarily skilled in the art that the display panel should have other essential constituent parts, which is not repeated here and should not be regarded as limitation to the present disclosure. Implementation of the display panel may refer to embodiments of the above display substrate, and repetitions are omitted.

An embodiment of the present disclosure further provides a display apparatus, including the display panel provided by the embodiment of the present disclosure.

In some embodiments, the display apparatus further includes: a light extraction device, where an orthographic projection of the light extraction device on the base substrate is located in a first display area and a second display area of the display substrate, and the light extraction device is arranged on a side of the display substrate facing away from a light emission surface.

In some embodiments, the light extraction device includes, for example, a camera module, an optical fingerprint recognition module, an ambient light sensor, etc.

The display apparatus provided by the embodiment of the present disclosure may be: any product or component with a display function, such as a mobile phone, a tablet computer, a television, a displayer, a notebook computer, a digital photo frame, and a navigator. It should be understood by those ordinarily skilled in the art that the display apparatus should have other essential constituent parts, which is not repeated here and should not be regarded as limitation to the present disclosure. Implementation of the display apparatus may refer to embodiments of the above display substrate, and repetitions are omitted.

To sum up, according to the display substrate, the display panel and the display apparatus provided by the embodiments of the present disclosure, the connection leads do not overlap the gate connection electrode of the second pixel driving circuit, so that the formation of the capacitance between the connection leads and the gate connection electrode of the second pixel driving circuit may be avoided, thus avoiding the jump of the driving current provided by the second pixel driving circuit, avoiding uneven brightness of light emission, and improving uniformity of light emitting brightness.

Apparently, those skilled in the art can make various modifications and variations to the embodiments of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A display substrate, comprising:
   a base substrate, comprising a display area and a border area arranged outside the display area, wherein the display area comprises: a first display area, and a second display area at least arranged on a side of the first display area;
   a plurality of light emitting devices, arranged on the base substrate in an array, wherein the plurality of light emitting devices comprise: a plurality of first light emitting devices in the first display area, and a plurality of second light emitting devices in the second display area;
   a plurality of pixel driving circuits, arranged between the base substrate and the light emitting devices, wherein the plurality of pixel driving circuits comprise: a plurality of first pixel driving circuits and a plurality of second pixel driving circuits, the plurality of first pixel driving circuits and the plurality of first light emitting devices are correspondingly electrically connected, the plurality of second pixel driving circuits at least partially overlap with the plurality of second light emitting devices, and the plurality of second pixel driving circuits are correspondingly electrically connected with the plurality of second light emitting devices, at least one of the plurality of second pixel driving circuits is provided with a driving transistor, a threshold compensation transistor, and a gate connection electrode, and the gate connection electrode is electrically connected with a gate electrode of the driving transistor and a source electrode of the threshold compensation transistor, or the gate connection electrode is electrically connected with a gate electrode of the driving transistor and a drain electrode of the threshold compensation transistor; and
   a plurality of connection leads, wherein each of at least part of the connection leads is electrically connected with at least one first pixel driving circuit and one first light emitting device, and orthographic projections of the connection leads on the base substrate do not overlap an orthographic projection of the gate connection electrode on the base substrate;
   wherein the second display area comprises a plurality of pixel driving circuit columns arranged in a first direction, and the plurality of pixel driving circuit columns comprise: a plurality of first pixel driving circuit columns and a plurality of second pixel driving circuit columns;

the first pixel driving circuit columns only comprise the plurality of first pixel driving circuits arranged in a second direction, and the first direction intersects with the second direction;

the second pixel driving circuit columns comprise: the plurality of first pixel driving circuits arranged in the second direction, and the second pixel driving circuits located between at least part of adjacent first pixel driving circuits in the second direction;

the first display area comprises a plurality of first light emitting device columns arranged in the first direction, and each of the plurality of first light emitting device columns comprises the plurality of first light emitting devices arranged in the second direction; and each first light emitting device in each of the plurality of first light emitting device columns is electrically connected with at least part of the first pixel driving circuits in one corresponding first pixel driving circuit column respectively;

wherein at least one of the plurality of connection leads comprises: a first lead portion extending in the second direction, a second lead portion extending in the second direction, and a third lead portion extending in the first direction and electrically connected with the first lead portion and the second lead portion;

the first lead portion is led out from the first pixel driving circuit columns and electrically connected with at least part of the first pixel driving circuits in the first pixel driving circuit columns;

the second lead portion is led out from the first light emitting device columns and electrically connected with the first light emitting devices in the first light emitting device columns;

an orthographic projection of the third lead portion on the base substrate does not overlap the first display area and the second display area; or, at least part of the orthographic projection of the third lead portion on the base substrate does not overlap the first display area and the second display area, and a rest part of the orthographic projection of the third lead portion on the base substrate has overlapping areas with the first display area and the second display area;

wherein the plurality of connection leads comprise: first connection leads, arranged between the pixel driving circuits and the light emitting devices;

the first connection leads comprise a plurality of layers of connection sub leads located in different film layers; and the connection sub leads located in different film layers are electrically connected with different first pixel driving circuits and first light emitting devices respectively, and the connection sub leads located in different film layers are not connected with each other;

wherein all the orthographic projections of the plurality of layers of connection sub leads on the base substrate do not overlap with each other;

at least one of the light emitting devices comprises: an anode, light emitting functional layers, and a cathode, and the anode, the light emitting functional layers, and the cathode are arranged sequentially in a stacked mode; and the connection leads further comprise:

second connection leads, arranged in a same layer as the anode, wherein the second connection leads are electrically connected with the first connection leads.

2. The display substrate according to claim 1, wherein the plurality of connection leads are arranged on a side of a layer where the plurality of pixel driving circuits are located facing away from the base substrate.

3. The display substrate according to claim 1, wherein the second lead portion only comprises the first connection leads, and materials of the first connection leads comprise transparent materials.

4. The display substrate according to claim 3, wherein the transparent materials comprise at least one of: indium tin oxide or graphene.

5. The display substrate according to claim 1, wherein in an area outside the first display area, at least one of the first lead portion or the third lead portion comprises the first connection leads and the second connection leads electrically connected with each other.

6. The display substrate according to claim 1, wherein the third lead portion is located in the border area adjacent to both the first display area and the second display area.

7. The display substrate according to claim 6, further comprising: a third connection lead electrically connected with the third lead portion in the border area.

8. The display substrate according to claim 7, wherein at least one of the plurality of pixel driving circuits comprises a gate connection electrode; and the pixel driving circuit further comprises: a first gate layer arranged between the base substrate and the gate connection electrode, and a second gate layer arranged between the first gate layer and the gate connection electrode; and the third connection leads are arranged on the same layer as one of the following film layers: the gate connection electrode, the first gate layer, and the second gate layer.

9. The display substrate according to claim 1, wherein at least one of the pixel driving circuits further comprises: a first transistor and a storage capacitor;

a gate electrode of the first transistor is electrically connected with a first reset signal end, and a source electrode of the first transistor is electrically connected with a first initial signal end;

a drain electrode of the first transistor, a first electrode of the storage capacitor, and the source electrode of the threshold compensation transistor are electrically connected with the gate electrode of the driving transistor;

a gate electrode of the threshold compensation transistor is electrically connected with a scanning signal end; and a second electrode of the storage capacitor is electrically connected with a power signal end.

10. A display apparatus, comprising the display substrate according to claim 1.

11. The display apparatus according to claim 10, further comprising:

a light extraction device, wherein an orthographic projection of the light extraction device on the base substrate is located in the first display area and the second display area of the display substrate, and the light extraction device is arranged on a side of the display substrate facing away from a light emission surface.

12. The display apparatus according to claim 10, wherein the plurality of connection leads are arranged on a side of a layer where the plurality of pixel driving circuits are located facing away from the base substrate.

* * * * *